United States Patent [19]

Nigro et al.

[11] Patent Number: 5,059,913

[45] Date of Patent: Oct. 22, 1991

[54] APPARATUS AND METHOD FOR ELECTRICAL TESTING OF INSULATING ARM SLEEVES USING A CONDUCTIVE LIQUID AND INFLATABLE SEALING MEMBER

[75] Inventors: Jack M. Nigro, Malvern; Roy O. Wilson, Bolivar, both of Ohio

[73] Assignee: The Hannon Company, Canton, Ohio

[21] Appl. No.: 628,852

[22] Filed: Dec. 13, 1990

[51] Int. Cl.$^5$ .............................................. G01R 31/16
[52] U.S. Cl. ........................................ 324/557; 73/40
[58] Field of Search .................... 324/557; 73/40, 41.2, 73/41.3, 41.4, 45.5; 340/605

[56] References Cited

U.S. PATENT DOCUMENTS

| | | | |
|---|---|---|---|
| 2,054,204 | 9/1936 | McDonald | 73/51 |
| 2,391,351 | 12/1945 | Schmidt | 73/40 |
| 2,609,094 | 9/1952 | FRX | 209/10 |
| 2,942,248 | 6/1960 | Huggins | 340/259 |
| 2,981,886 | 4/1961 | Beck | 324/54 |
| 3,093,793 | 6/1963 | Hicken | 324/54 |
| 3,414,808 | 12/1968 | Thomas | 324/54 |
| 3,417,327 | 12/1968 | Breidenbach | 324/557 |
| 4,583,039 | 4/1986 | Kolcio et al. | 324/557 |
| 4,810,971 | 3/1989 | Marable | 324/557 |
| 4,909,069 | 3/1990 | Albin et al. | 324/557 X |

*Primary Examiner*—Gerard R. Strecker
*Attorney, Agent, or Firm*—Michael Sand Co.

[57] ABSTRACT

This invention relates to an improved arm sleeve testing apparatus and method of testing such tubular sleeves to determine whether any flaws or defects exist in their sidewalls which would permit the conduct of electrical current. The sleeves are sealed at their lower smaller ends by an inflatable sealing member which seals the inner sidewall surfaces in pressure-tight relation within a non-conductive cup-like member. The sleeves are mounted on a vertically-reciprocatable platform in vertical relation over an insulated tank containing a supply of conductive liquid. A second conductive liquid is introduced into the sleeve and an electrical current of predetermined magnitude is passed between the two liquids with the sleeve sidewalls therebetween. Any defects or flaws in the sidewalls permit electrical current flow which is detected by a visual signal or by an audible alarm indicating the sleeve is unsatisfactory for use in handling live power lines, for example.

21 Claims, 2 Drawing Sheets

APPARATUS AND METHOD FOR ELECTRICAL TESTING OF INSULATING ARM SLEEVES USING A CONDUCTIVE LIQUID AND INFLATABLE SEALING MEMBER

BACKGROUND OF THE INVENTION

1. Technical Field

The subject invention relates to apparatus and method of testing insulating arm sleeves such as those used in combination with insulating gloves in the electrical power industry for maintenance of live power lines. More particularly, the invention relates to electrical insulating arm sleeves in which the complete arm sleeves are tested for electrical defects in an efficient and safe manner for use and protection when handling live power lines.

2. Background Information

Electrical testing of insulating arm sleeves used by electricians and electrical utility linemen for performing live line maintenance work has been conducted heretofore to detect defects or flaws in such sleeves to ensure their safe use to prevent electrical shock injury to such workers. Previously, the smaller end of such frusto-conical shaped arm sleeves has been retained within a bath of Freon liquid while the sleeves are partially immersed in a tank of different conductive liquid. An electrode is introduced into the sleeve which is filled with a conductive liquid to essentially the same level as in the tank. An electrical potential is established between the conductive liquids in the sleeve and the immersion tank, the electrical potential difference between the liquids causing a breakdown in the sleeve at damaged or defective areas. Normally, such breakdown actuates a visible signal or an audible alarm during the performance of the sleeve testing procedure.

In related test procedures which are made on many types of insulating gloves, disadvantages have been found in placing electrical stresses at the junction of the water surface and cuff of the glove. Such stresses which occur at the water surface attain such level whereby the surrounding air is ionized resulting in the production of ozone and corona effects. Most insulating gloves being comprised of natural or synthetic rubber are adversely affected by the occurrence of ozone which is destructive of such materials. The high electrical stress which occurs at the top area frequently results in excessive glove failure during tests. Such gloves have also required that they have relatively long cuff areas to enable the gloves to be adequately tested. Such increased cuff lengths on the glove make the gloves more cumbersome for wear during their use as well as adding to their cost of manufacture.

The aforesaid testing of gloves is relatively easy to perform where the gloves have only one cuff opening and are able to contain the conductive liquid with the cuff opening held upright. The arm sleeves being tubular having upper and lower openings cannot be similarly tested unless the lower opening is sealed to contain the liquid during testing.

The testing of insulated arm sleeves utilizing Freon liquid to contain the smaller end of the sleeves is one which must be avoided in view of restricted use of Freon-type materials which are considered to possess toxic properties. The smaller end of the sleeves must be retained in liquid-tight closed relation in order to perform the electrical testing by means of the two electrically-isolated conductive liquids on both sides of the sleeves. The smaller ends must be restrained in pressure tight relation by non-metallic elements which facilitate establishing the electrical potential difference between opposite sides of the sleeve to detect manufacturing flaws or damaged areas incurred during previous use. Such repeated testing on both new and used arm sleeves is imperative in view of the hazardous conditions encountered by workmen in the electrical power industry who are required to wear such protective safety apparel.

SUMMARY OF THE INVENTION

The subject invention provides an improved electrical testing apparatus and method of testing insulating arm sleeves in which the arm sleeves are mounted in vertical relation having a non-conductive retention device for the smaller ends of the sleeves. The smaller ends are retained in a rigid cup-like member having a non-conductive flexible lining and an inflatable hollow bladder for sealing off the sleeve interior at the lower smaller end. The sleeve is capable of retaining a conductive fluid while mounted within a second conductive liquid for applying an electrical potential between the two conductive liquids. The testing procedures may be conducted without generating destructive ozone or corona effects, and without damage to the sleeve while evaluating the same for any inherent flaws or damaged areas which would permit the flow of electrical current through the sleeve walls.

The combined testing apparatus for the arm sleeves comprises a platform for retaining the sleeves in vertical relation which platform may be raised and lowered to immerse the sleeves within the conductive fluid retained within a stationary tank. The arm sleeves being tubular with open ends are sealed at their lower extremity within a rigid cup-like member by an inflatable sealing bladder, the ends being retained within a rigid cup-like member. The sleeves being sealed at their lower extremity are then filled with a conductive fluid with an electrode immersed in such conductive fluid. The electrode is mounted in vertical alignment within each of the arm sleeves. The sleeves are lowered into the tank conductive fluid and an electrical potential difference applied between the two conductive fluids which are maintained at essentially the same level both interiorly and exteriorly of the sleeves. The sleeves smaller ends are sealed by an inflatable bladder member preferably comprised of natural or synthetic rubber at the sleeve smaller end which is normally encompassed by the cuff of an insulating glove when worn in combination therewith by electrical workmen. A tubular electrode inserted into the interior conductive fluid within the sleeves serves as both an electrode and a filling tube for the conductive liquid. Automatic or manual methods may be employed to fill the interior of the sleeves with the liquid prior to testing, one form of automatic filling apparatus being disclosed in U.S. Pat. No. 4,583,039 entitled Electrical Testing Device for Insulating Gloves. While such apparatus is useful for testing gloves, it is incapable of testing arm sleeves having twin openings which are used in combination with such gloves.

A further object of this invention is to provide testing apparatus in which a plurality of arm sleeves are mounted on a single platform which may be raised and lowered with respect to the test tank by an elevator mechanism. Each of the arm sleeves is sealed at its lower smaller end prior to such mounting so that the sleeve interior can retain a conductive liquid introduced either prior to or subsequent to its immersion in the tank conductive liquid. An electrode is mounted in coaxial alignment within each of the sleeves so that an electrical current at a substantial electrical differential can be applied between the two conductive fluids and thereby on opposite sides of the sleeve sidewalls. The lower ends of the sleeves are retained and sealed by non-conductive elements which prevent any shorting out or electrical current flow between walls of the sleeves during the testing procedure.

A still further object of this invention is to provide testing apparatus and method which facilitate the simultaneous electrical testing of a plurality of arm sleeves without damaging the same and which apparatus is relatively inexpensive in both construction and operation, and which solves the problems of such testing without the use of toxic non-conductive fluorocarbon compounds which exposed use has been prohibited.

The aforesaid objectives and advantages are obtained by the subject improved electrical arm sleeve testing apparatus and method wherein the general nature of which may be stated as including a vertically reciprocatable platform; tank means located beneath the platform for holding a supply of conductive liquid; elevator means for raising and lowering the platform with respect to the fluid containing tank; arm sleeve mounting means for releasably suspending an arm sleeve to be tested from the platform; electrode means for insertion into the interior of the sleeve when suspended from the platform by the sleeve mounting means; means for filling a suspended sleeve with a conductive liquid; and means for applying an electrical potential of predetermined magnitude between the two liquids on opposite sides of the sleeve for determination of inherent flaws or damaged areas which would permit the flow of electrical current through the sleeve side walls.

BRIEF DESCRIPTION OF THE DRAWINGS

A preferred embodiment of the invention, illustrative of the best mode in which the applicants have contemplated applying the principles, is set forth in the following description and is shown in the drawings, and is particularly and distinctly pointed out and set forth in the appended claims.

Similar numerals refer to similar parts throughout the drawings.

DESCRIPTION OF THE PREFERRED EMBODIMENT

Figure 1:
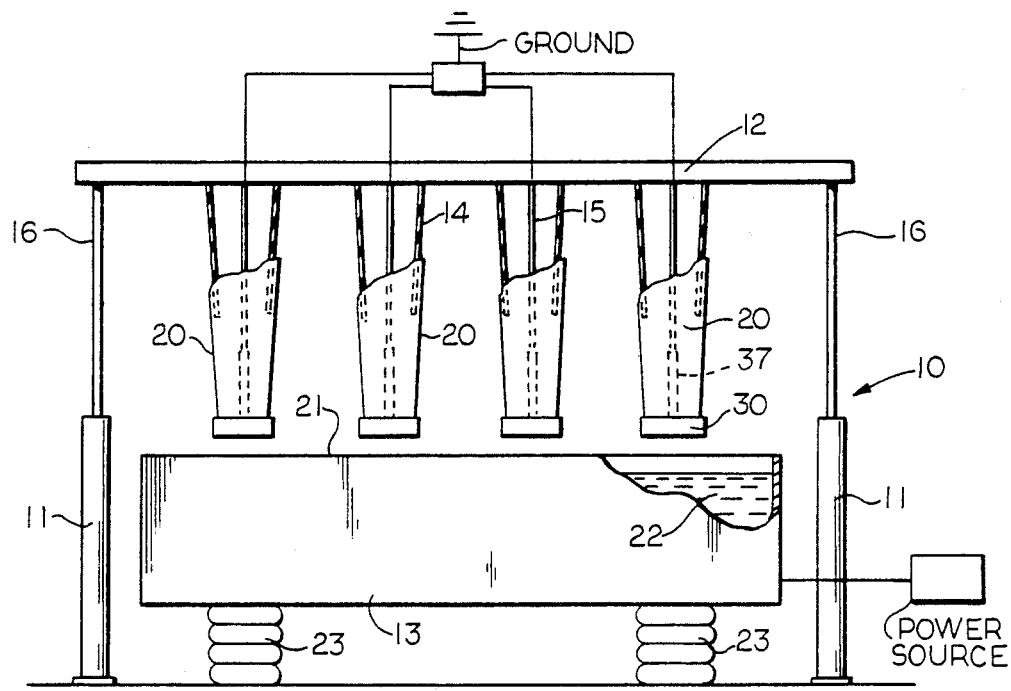
FIG. 1 is a diagrammatic elevational view of a plurality of insulating arm sleeves mounted on a platform which is movably mounted on an elevator positioned above a conductive liquid test tank.

The improved electrical testing apparatus for insulating arm sleeves is indicated generally at the numeral 10 as shown in FIG. 1. The apparatus 10 includes as main components a supporting elevator structure indicated generally at 11, a movable platform 12, a supply tank 13 containing a conductive liquid, a sleeve mounting assembly 14 and a water filling tube 15 which may also serve as an electrode for energizing a conductive liquid contained within an individual sleeve. The vertically movable elevator 11 may have various structural arrangements and configurations other than that shown in FIG. 1 which consists primarily of a pair of vertical end supports 16 having a hydraulic or pneumatic piston element (not shown) at each end for raising and lowering the platform. Platform 12 is a rigid horizontal support on which a plurality of arm sleeves 20 and their mounting assemblies 14 are mounted from the lower surface thereof. Platform 12 and the sleeve supporting assemblies 14 are normally at the same potential and are electrically grounded for test purposes.

Liquid supply tank 13 is of special construction capable of reducing electrical stresses in the liquid and sleeve mounting apparatus having an open top 21 which is filled with a conductive liquid 22 which is normally water and may contain dissolved conductive salts. The tank 13 is supported by a plurality of insulators 23 capable of withstanding the maximum test voltage to thereby comprise an insulated and electrically isolated tank.

Figure 2:
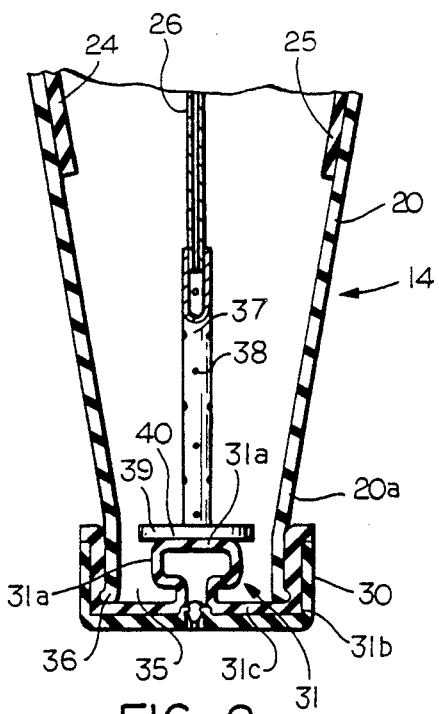
FIG. 2 is an enlarged vertical fragmentary sectional view of an arm sleeve mounted on a sleeve retention assembly of the improved testing apparatus with the sleeve sealing means in unsealed relation.

The sleeve mounting assembly 14 is shown in greater detail in FIG. 2 which includes a pair of downwardly converging rod-like brackets 24 and 25 which interiorly engage the internal sidewall of the upper larger end of the sleeve 20. The sleeves are frusto-conical in shape with open ends having a tubular configuration to fit most arm sizes. The sleeves may vary in dimensions and sizes, or be sufficiently stretchable to fit average arm sizes. The sleeve mounting brackets are connected to the underside of the platform 12 extending downwardly therefrom, the brackets being preferably formed of relatively rigid dielectric material to provide an insulating support of the sleeve 20 at its upper larger extremity. The brackets are essentially free of any electrically conductive materials such as metal which may permit electrical arcing from the sleeve sidewalls to the support brackets during the testing procedure.

Each of the arm sleeves 20 is mounted at its larger end on the downwardly projecting brackets 24 and 25 which engage the larger end of the sleeve and is retained thereon by positive clamping means (not shown) to retain the sleeves in vertical relation. A tubular electrode 26 extends downwardly in axial alignment with the upright sleeve, the electrode extending to a position below the lower ends of the support brackets. A perforated hollow tube 37 formed of plastic or other dielectric material, is attached to the lower end of electrode 26 and is formed with a plurality of holes 38. A disc 39, also of a dielectric material, is mounted on the extended end of tube 37 and engages top surface 40 of a sealing member 31.

Figure 3:
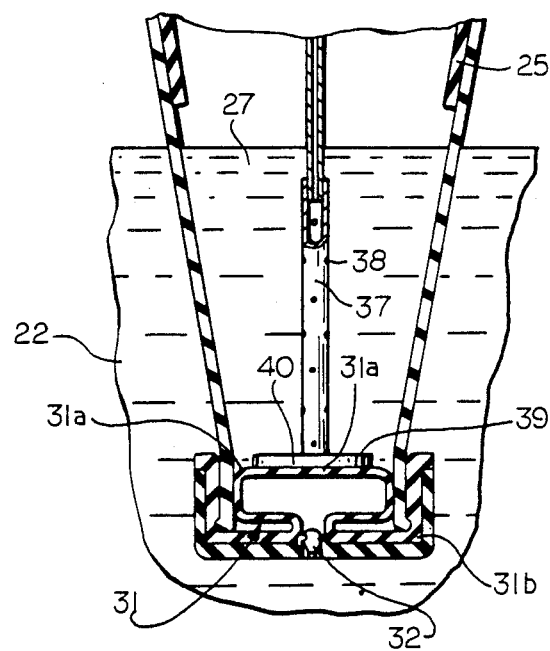
FIG. 3 is a view similar to FIG. 2 of the sleeve sealing means in inflated condition sealing off the lower smaller end of an individual arm sleeve.
Figure 4:
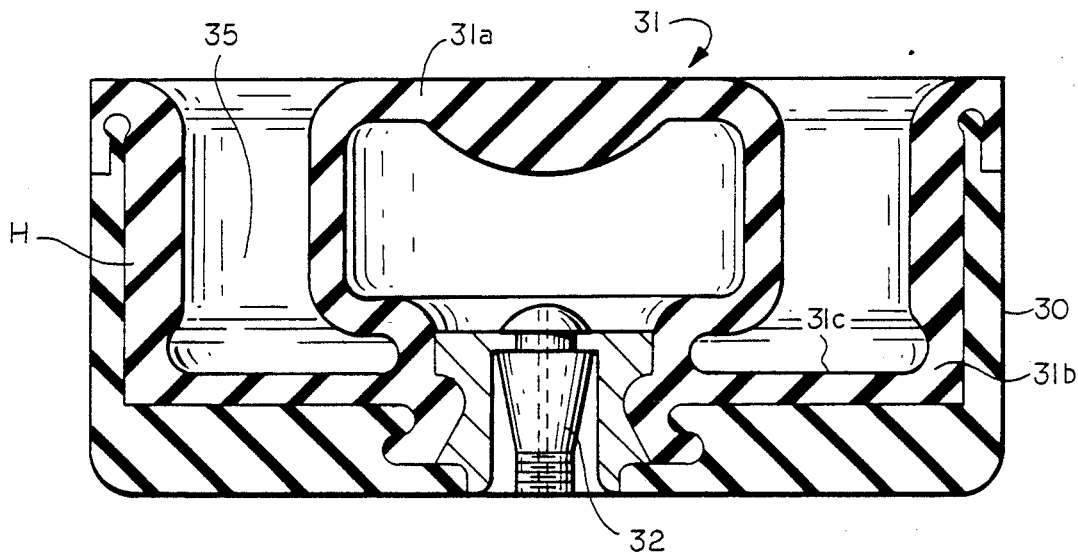
FIG. 4 is a substantially enlarged sectional view of the sealing means for sealing off the lower smaller end of an individual sleeve.

The smaller end of each sleeve 20 is fitted within a rigid plastic cup-like member 30 having a circular configuration with a slightly larger diameter than the sleeve smaller end. A sealing member 31 is preferably comprised of elastomeric material and mounted within the cup-like member 30, the sealing member having both an inflatable central body portion 31a and a cylindrical cup lining wall portion 31b which is connected to central portion 31a by an annular portion 31c. Wall portion 31b and annular portion 31c preferably are bonded by an adhesive to the respective portion of cup member 30. Wall portions 31b provides an insulating lining for the cup member. An annular space 35 is formed between central portion 31a when in a deflated position as shown in FIGS. 2 and 4, for receiving the cuff 36 of sleeve 20 therein. Such cup member is preferably comprised of non-conductive material such as a rigid plastic, the sealing member being comprised of elastomeric material such as natural or synthetic rubber. A central lower portion of the sealing member 31 has a valve element 32 mounted therewithin to permit inflation of the body portion which is similar to a bladder to seal off the lower inner sidewalls of the arm sleeve. Air pressure of the order of about 15 to 18 psi is employed to inflate the body portion from its collapsed arrangement as shown in FIG. 2 to the inflated enlarged configuration shown in FIG. 3.

After the sealing member 31 is inflated to seal the sleeve smaller end within cup-like member 30, a conductive fluid 27 is introduced into the interior of the sleeve which is then filled through either the tubular electrode 26 or by a separate filling tube. The sleeve is filled to a level below the extremities of support brackets 24 and 25 and to a level wherein the electrode is immersed in the liquid sufficiently deep to ensure good electrical contact therewith.

The rigid cup-like member 30 and the elastomeric sealing member 31 are shown in greater detail in FIG. 4. The sealing member has an outer U-shaped configuration to essentially line the cup member and provides an inflatable body portion within the upstanding walls of the cup member. Air pressure valve 32 which may be comparable to an automobile tire valve is mounted centrally between the inflatable body portion and the exterior of the cup to facilitate inflation of the body portion from a source of pressurized air (not shown). Disc 39 and tube 37 prevents the lower end of sleeve 20 and sealing member 31 from attempting to move within liquid 22 due to the buoyancy imparted thereto by inflated member 31.

Figure 5:
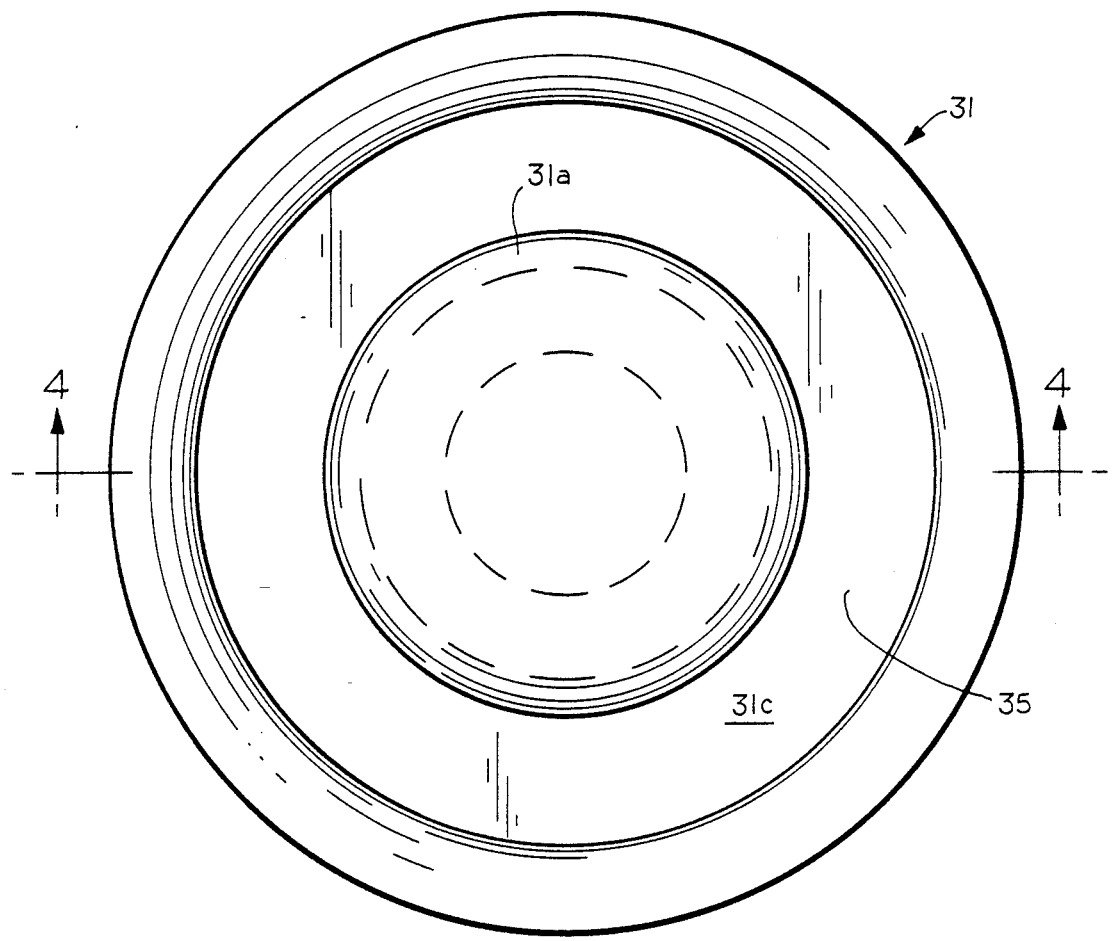
FIG. 5 is a top plan view of the sleeve sealing means shown in FIG. 4.

FIG. 5 shows the circular configuration of the cup member 30 and sealing member 31 which are adapted to receive the sleeve smaller end which normally has a slightly enlarged cuff portion at its lower extremity to ensure firm engagement with the lower arm or wrist area of the wearer.

In practicing the method of this invention, the liquid-filled arm sleeve is immersed within the supply tank in such manner that the two conductive liquid levels are essentially co-planar for preferred testing of the sleeve. An electrical potential of the order of about 5 KVAC to 40 KVAC and about 20 KVDC to 50 KVDC is applied between the two liquids, the tank being positively charged and the electrode being grounded such that the insulating arm sleeve has electrical current applied to its opposing sidewall surfaces. Either direct or alternating electrical current may be employed in the test, the latter having a relatively high voltage being preferred. Any manufacturing defects or damaged areas of the arm sleeve are determined to exist by either arcing or electrical discharge through the sleeve sidewall at such areas which is shown to exist either by a visible signal or audible sounds of an alarm. Normally if the sleeve is found to contain any electrical flaws, it is discarded from further use as being unsatisfactory for use as protective apparel. Obviously the sleeves must be tested prior to their initial use as well as periodically during their useful life to ensure the safety of user workmen employed in the electrical power supply industry.

Accordingly, the improved electrical testing apparatus and method of testing arm sleeves of this invention are simplified, provide a reliable, safe inexpensive and efficient apparatus which achieves all of the enumerated objectives, provides for eliminating difficulties encountered with prior art apparatus and methods, solves unique problems, and obtains new results in the art.

In the foregoing, certain terms have been used for brevity, clearness and understanding; but no unnecessary limitations are to be implied therefrom beyond the requirements of the prior art, because such terms are used for descriptive purposes and are intended to be broadly construed.

Moreover, the description and illustration of the invention is by way of example, and the scope of the invention is not limited to the exact details shown or described.

Having now described the features, discoveries and principles of the invention, the manner in which the improved testing apparatus for protective arm sleeves is constructed and used in several forms, the characteristics of the construction, and the advantageous, new and useful results obtained; the new and useful structures, devices, elements, arrangements, parts and combinations, are set forth in the appended claims.

We claim:

1. Improved apparatus for the electrical testing of insulating arm sleeves comprising:
    a) a platform;
    b) tank means located beneath the said platform for retaining a bath of conductive liquid;
    c) elevator means for raising and lowering the said platform with respect to said tank means;
    d) arm sleeve mounting means for releasably suspending an arm sleeve to be tested from the said platform;
    e) a rigid cup-like member mounted below and in vertical alignment with said arm sleeve adapted to receive the smaller end of said arm sleeve;
    f) an inflatable flexible sealing means adapted to be inserted within the smaller end of said arm sleeve to forcibly internally seal the same within the interior of said cup-like member when inflated with fluid pressure;
    g) electrode means for insertion into the interior of said arm sleeve from its larger end when suspended from the said platform by the said arm sleeve mounting means;
    h) means for filling a suspended arm sleeve with a conductive liquid with the said electrode means therewith; and
    i) means for applying from an electrical power source an electrical potential between the two isolated liquids contained in the suspended arm sleeve and the said tank means containing such arm sleeve respectively to determine any electrically insulating defects in said arm sleeve.

2. The improved apparatus as defined by claim 1, wherein said inflatable sealing means comprises an air-inflatable bladder which is adapted to seal the smaller end of said arm sleeve in pressure-tight relation within said rigid cup-like member, and a source of pressurized air to inflate said bladder.

3. The improved apparatus as defined by claim 2, wherein said inflatable sealing means comprises an air inflatable bladder having valve means for retaining air pressure within said bladder and releasing same following testing.

4. The improved apparatus as defined by claim 1, wherein said cup-like member has a circular configuration and dimensions closely complemental to the smaller end of said arm sleeve.

5. The improved apparatus as defined by claim 2, wherein said inflatable bladder member has a molded circular configuration to both line the interior of said cup-like member and a hollow body portion having a valve element therein to retain air pressure within said body portion and against the interior of the smaller end of said arm sleeve.

6. The improved apparatus as defined by claim 1, wherein the said arm sleeve is comprised of an electrically-insulating elastomeric material having a frustoconical configuration, the smaller end of said arm sleeve having an enlarged cuff portion adapted to be retained within said cup-like member in pressure-tight relation.

7. The improved apparatus as defined by claim 1, wherein the said rigid cup-like member is adapted to contain the smaller end of said arm sleeve, and said sealing means comprises an inflatable elastomeric bladder adapted to seal such smaller sleeve end against and within said cup-like member in liquid-tight relation.

8. The improved apparatus as defined by claim 1, wherein said means for applying an electrical potential comprises a ground electrode mounted within said arm sleeve and a high voltage source connected to said tank means.

9. The method of testing the insulating property of an electrically insulating arm sleeve comprising the steps of:
a) retaining the smaller end of said arm sleeve in a rigid cup-like member having a similar configuration;
b) inserting a hollow inflatable flexible sealing means having a bulbous portion into the smaller end of said arm sleeve member;
c) inflating the bulbous portion of said sealing means to seal the smaller end of said arm sleeve in liquid-tight relation interiorly within said rigid cup-like member;
d) supporting the said arm sleeve in vertical relation above a tank containing a first conductive liquid;
e) introducing a second conductive liquid into the interior of said arm sleeve;
f) placing said arm sleeve containing said second conductive liquid into the said tank containing said first conductive liquid; and
g) applying an electrical potential of predetermined magnitude between the said two isolated conductive liquids to thereby indicate any electrical current leakage through the wall of said arm sleeve.

10. The method as defined by claim 9, including the step of employing air pressure from a source of pressurized air to inflate said sealing means within said cup-like member.

11. The method as defined by claim 9, including the step of introducing an electrode into the said second conductive liquid contained within said arm sleeve for applying said electrical potential between the two isolated conductive liquids.

12. The method as defined by claim 9, wherein said sealing means comprises an inflatable hollow bladder member having a surrounding molded circular configuration complemental to the interior of said rigid cup-like member.

13. The method as defined by claim 9, including the step of introducing a rod-like electrode into the said conductive liquid contained within said arm sleeve in vertical alignment therewith for applying said electrical potential.

14. The method as defined by claim 9, including the step of retaining the smaller end of said arm sleeve within said rigid cup-like member by a hollow inflatable elastomeric bladder member which provides both a lining for said rigid cup-like member and is inflatable against the interior surface of said arm sleeve smaller end.

15. The method as defined by claim 9, wherein said first and second conductive liquids are water.

16. An inflatable sealing device for sealing an open end of an elastomeric sleeve for electrical testing of said sleeve, said device including a rigid cup-like member formed of a dielectric material, an air inflatable bladder portion mounted within the rigid cup-like member to be positioned within the open end of the sleeve and expanded outwardly to seal said sleeve end interiorly in pressure-tight relation within said rigid cup-like member; and valve means mounted on the rigid member and communicating with the inflatable bladder portion for introducing pressurized air into the bladder portion to inflate said bladder portion.

17. The sealing device defined in claim 16 in which the rigid member in an integral one-piece member having a disc-shaped bottom wall and a cylindrical side wall; and in which the valve means is mounted in the center of the bottom wall.

18. The sealing device defined in claim 17 in which the inflatable bladder includes an inflatable central portion surrounded by a cylindrical wall spaced therefrom, wherein said cylindrical wall is attached to an inner surface of the cylindrical side wall of the rigid member.

19. The sealing device defined in claim 18 in which the inflatable central portion of the bladder is connected to the cylindrical wall by an annular portion; and in which said annular portion is bonded to the bottom wall of the rigid member.

20. The sealing device defined in claim 18 in which an annular space is formed between the inflatable central portion of the bladder and the cylindrical wall thereof when the bladder is in a deflated condition; and in which the open end of the elastomeric sleeve is adapted to be located within the annular space.

21. The sealing device defined in claim 16 including a dielectric rod means engaging the inflatable bladder for retaining said bladder in a predetermined position upon inflation.

* * * * *